United States Patent [19]
Mikami

[11] Patent Number: 5,486,828
[45] Date of Patent: Jan. 23, 1996

[54] CODING/DECODING METHOD AND APPARATUS THEREFOR

[75] Inventor: Fumiyuki Mikami, Yokohama, Japan

[73] Assignee: Canon Kabushiki Kaisha, Tokyo, Japan

[21] Appl. No.: 169,539

[22] Filed: Dec. 17, 1993

Related U.S. Application Data

[63] Continuation of Ser. No. 27,581, Mar. 5, 1993, which is a continuation of Ser. No. 504,623, Apr. 4, 1990.

[30] Foreign Application Priority Data

Apr. 6, 1989 [JP] Japan ................................ 1-85659
Jul. 18, 1989 [JP] Japan ................................ 1-183582

[51] Int. Cl.$^6$ .................................................. H03M 7/00
[52] U.S. Cl. ................................. 341/59; 341/95; 360/40
[58] Field of Search .............................. 341/59, 95, 106; 360/39, 40

[56] References Cited

U.S. PATENT DOCUMENTS

| | | | |
|---|---|---|---|
| 4,115,768 | 9/1978 | Eggenberger et al. | 341/59 |
| 4,494,151 | 1/1985 | Liao | 341/59 |
| 4,553,131 | 11/1985 | Endoh | 341/59 |
| 4,728,929 | 3/1988 | Tanaka | 341/95 |
| 4,760,378 | 7/1988 | Iketami et al. | 341/59 |
| 4,833,470 | 5/1989 | Iketami | 341/59 |
| 4,860,324 | 8/1989 | Satomura | 375/122 |
| 4,882,583 | 11/1989 | Dimitri et al. | 341/59 |
| 4,987,700 | 1/1991 | Mikami | 341/59 |

*Primary Examiner*—Marc S. Hoff
*Attorney, Agent, or Firm*—Fitzpatrick, Cella, Harper & Scinto

[57] ABSTRACT

A coding method and apparatus convert a data word of m×r bits into a code word of n×r bits (m<n) with regard to a predetermined number r. The basic data word length m is made two or three bits, basic code word length n is made five bits and the predetermined number r satisfies the relation $1 \leq r \leq 4$ or $1 \leq r \leq 2$ respectively, the data word of m×r bits is converted into a code word of 5r bits, and coding is performed in such a manner that the run number of "0"s is greater than four and less than 19, or greater than one and less than five respectively. Further, a decoding method and apparatus decode perform decoding in accordance with the logical expressions $Y_1 = X_{13} + X_{14} \cdot (X_{19} + X_{20}) + \overline{X_9} \cdot \overline{X_{10}} \cdot X_{15} + \overline{X_9} \cdot \overline{X_{10}} \cdot \overline{X_{11}} \cdot \overline{X_{12}} \cdot \overline{X_{13}} \cdot \overline{X_{14}} + (X_4 + X_5) \cdot X_{10} \cdot \overline{X_{15}}$ $Y_2 = X_{12} + X_{13} + X_{14} + X_{15} + X_4 \cdot (X_9 \cdot \overline{X_{14}} + X_{10}) \cdot \overline{X_{15}}$ where $X_1$–$X_{20}$ represents the bit series of a code word coded in such a manner that a data word of 2×γ bits is converted into a code word of 5×γ bits, where basic data word length m of a digital signal is two bits, basic code word length n is five bits and γ is an integer, and such that a run length of "0"s between a "1" and a "1" of a binary code word pattern obtained by interconnecting the code words following conversion is greater than 4, and γ satisfies the relation $1 \leq \gamma \leq 3$, $Y_1$, $Y_2$ represent a bit series of a decoded data word, and X indicates the inverted value of a bit.

9 Claims, 18 Drawing Sheets

| DATA WORD | | CODE WORD |
|---|---|---|
| A | a | (10000) |
| B | b | (01000) |
| C | c | (00100) |
| D | d | (00010) |
| BA | af | (10000 00000) |
| CA | bf | (01000 00000) |
| CB | cf | (00100 00000) |
| DA | df | (00010 00000) |
| DB | ef | (00001 00000) |
| BBA | aff | (10000 00000 00000) |
| CCA | bff | (01000 00000 00000) |
| DCA | cff | (00100 00000 00000) |
| DCB | dff | (00010 00000 00000) |
| DCC | eff | (00001 00000 00000) |
| DCD | eef | (00001 00001 00000) |
| BBBA | eeff | (00001 00001 00000 00000) |
| CCCA | eeef | (00001 00001 00001 00000) |
| DDCA | efff | (00001 00000 00000 00000) |

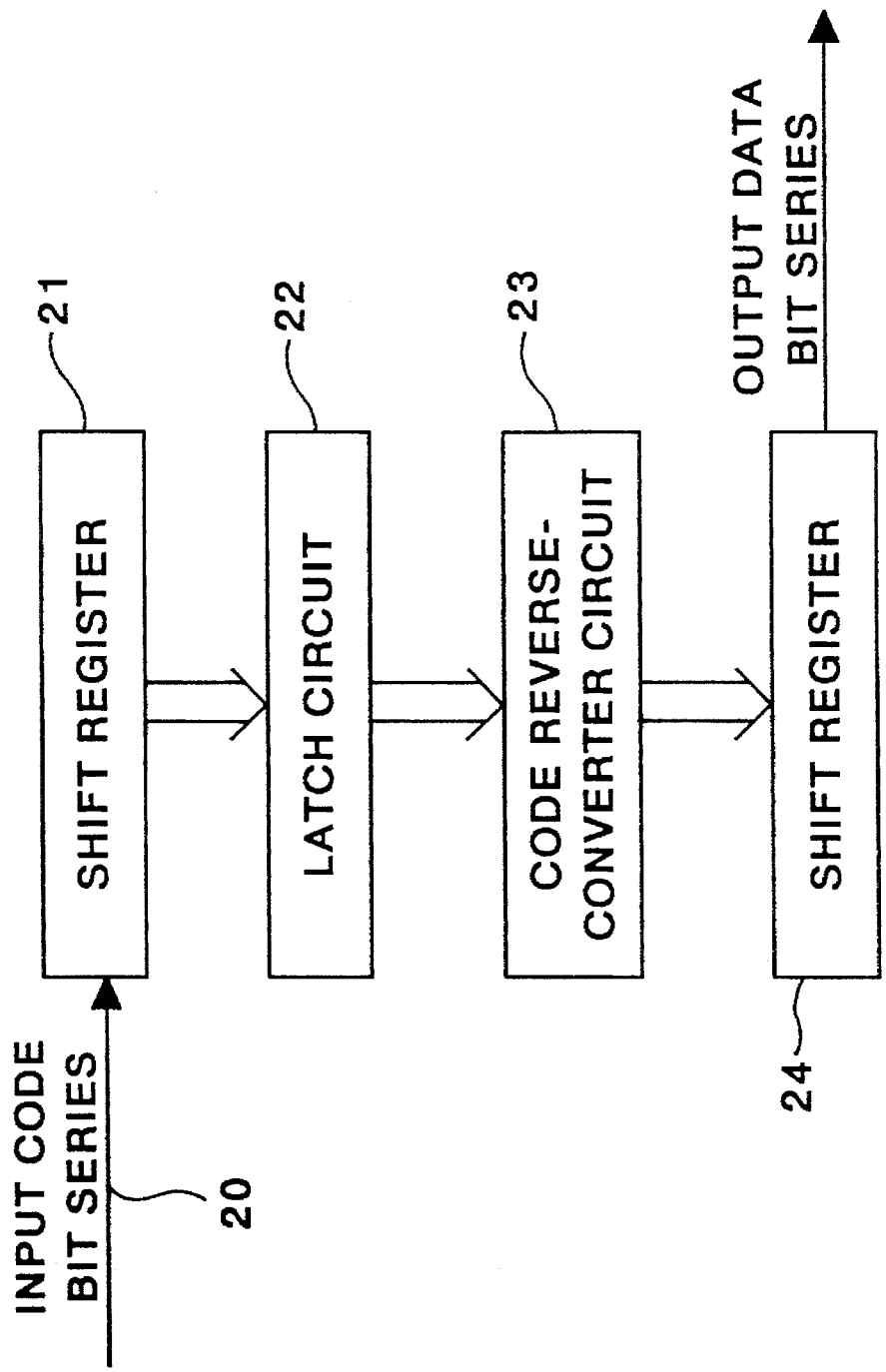
F I G. 2

| DATA WORD | | CODE WORD |
|---|---|---|
| A | a | (10000) |
| B | b | (01000) |
| C | c | (00100) |
| D | d | (00010) |
| BA | af | (10000 00000) |
| CA | bf | (01000 00000) |
| CB | cf | (00100 00000) |
| DA | df | (00010 00000) |
| DB | ef | (00001 00000) |
| BBA | aff | (10000 00000 00000) |
| CCA | bff | (01000 00000 00000) |
| DCA | cff | (00100 00000 00000) |
| DCB | dff | (00010 00000 00000) |
| DCC | eff | (00001 00000 00000) |
| DCD | eef | (00001 00001 00000) |
| BBBA | eeff | (00001 00001 00000 00000) |
| CCCA | eeef | (00001 00001 00001 00000) |
| DDCA | efff | (00001 00000 00000 00000) |

FIG. 3

| DATA WORD | CODE WORD |
|---|---|
| 10 | 0100 |
| 11 | 1000 |
| 000 | 000100 |
| 011 | 001000 |
| 010 | 100100 |
| 0010 | 00100100 |
| 0011 | 00001000 |

(2,7) RLL

FIG. 4A

| DATA WORD | CODE WORD |
|---|---|
| 1 | 0 1 |
| 0 | X 0 |

MFM

FIG. 4B

BASIC CODE WORD a ------→ 10000
b ------→ 01000
c ------→ 00100
d ------→ 00010
e ------→ 00001
f ------→ 00000

FIG. 5

SUCCEEDING BASIC CODE WORD

|   | a | b | c | d | e | f |
|---|---|---|---|---|---|---|
| a | ○ | ○ | ○ | ○ | ○ | ○ |
| b | X | ○ | ○ | ○ | ○ | ○ |
| c | X | X | ○ | ○ | ○ | ○ |
| d | X | X | X | ○ | ○ | ○ |
| e | X | X | X | X | ○ | ○ |
| f | ○ | ○ | ○ | ○ | ○ | ○ |

PRECEDING BASIC CODE WORD

|   | DATA WORD |
|---|---|
| A | 0 0 |
| B ←--→ | 0 1 |
| C | 1 0 |
| D | 1 1 |

(ASSIGNMENT IS ARBITRARY)

| DATA WORD | CODE WORD |
|---|---|
| A | 1000X |
| B | 0100X |
| C | 0010X |
| D | 00010 |
| E | 1010X |
| F | 10010 |
| G | 01010 |
| H | 00001 |
| HA | 01000 0100X |
| HE | 00100 0100X |
| HF | 00100 0010X |

X REPRESENTS COMPLEMENT ON SUCCEEDING ONE BIT

FIG. 9

| | DATA WORD |
|---|---|
| A | 000 |
| B | 001 |
| C | 010 |
| D ↔ | 011 |
| E | 100 |
| F | 101 |
| G | 110 |
| H | 111 |

FIG. 10

| | CODE WORD |
|---|---|
| | 10000 |
| | 01000 |
| | 00100 |
| | 00010 |
| | 00001 |
| | 10100 |
| | 01010 |
| | 00101 |
| | 10010 |
| | 01001 |
| | 10001 |
| | 10101 |
| | 00000 |

FIG. 11

| | CODE WORD |
|---|---|
| A | 10000 |
| B | 01000 |
| C | 00100 |
| D | 00010 |
| E | 10100 |
| F | 10010 |
| G | 00000 |

FIG. 12

| | CODE WORD |
|---|---|
| A | 1000X |
| B | 0100X |
| C | 0010X |
| D | 00010 |
| E | 1010X |
| F | 10010 |
| G | 01010 |
| H | 00001 |

X REPRESENTS COMPLEMENT ON SUCCEEDING ONE BIT

| | DATA WORD | | CODE WORD |
|---|---|---|---|
| r = 1 | A (00)<br>B (01)<br>C (10)<br>D (11) | ↔<br>↔<br>↔<br>↔ | a (10000)<br>b (01000)<br>c (00100)<br>f (00000) |
| r = 2 | B A (0100)<br>C A (1000) | ↔<br>↔ | d f (00010 00000)<br>e f (00001 00000) |
| r = 3 | C B B (100101)<br>C B C (100110)<br>C B D (100111) | ↔<br>↔<br>↔ | d d f (00010 00010 00000)<br>d e f (00010 00001 00000)<br>e e f (00001 00001 00000) |

FIG. 15

| | DATA WORD | | CODE WORD |
|---|---|---|---|
| r = 1 | A (10)<br>B (11)<br>C (01)<br>D (00) | ↔<br>↔<br>↔<br>↔ | a (10000)<br>b (01000)<br>c (00100)<br>f (00000) |
| r = 2 | C A (0110)<br>B A (1110) | ↔<br>↔ | d f (00010 00000)<br>e f (00001 00000) |
| r = 3 | C B B (011111)<br>C B C (011101)<br>C B D (011100) | ↔<br>↔<br>↔ | d d f (00010 00010 00000)<br>d e f (00010 00001 00000)<br>e e f (00001 00001 00000) |

FIG. 20A (PRIOR ART)

| DATA TO BE CONVERTED (8 BITS) | CONVERTED DATA |||||||
|---|---|---|---|---|---|---|---|
| LSN (LEAST SIGNIFICANT 4 BITS) | 4/15 CODE ||||||||
| | BIT 1 | 3 | 5 | 7 | 9 | 11 | 13 |
| 0 | 1 | 0 | 0 | 0 | 0 | 0 | 0 |
| 1 | 1 | 0 | 1 | 1 | 0 | 0 | 0 |
| 2 | 1 | 0 | 0 | 0 | 1 | 0 | 0 |
| 3 | 1 | 0 | 0 | 0 | 0 | 1 | 0 |
| 4 | 0 | 1 | 0 | 0 | 0 | 0 | 1 |
| 5 | 0 | 1 | 0 | 1 | 0 | 0 | 0 |
| 6 | 0 | 1 | 0 | 0 | 1 | 0 | 0 |
| 7 | 0 | 0 | 0 | 0 | 0 | 1 | 0 |
| 8 | 0 | 0 | 1 | 0 | 0 | 0 | 1 |
| 9 | 0 | 0 | 1 | 0 | 1 | 0 | 0 |
| A | 0 | 0 | 0 | 0 | 0 | 1 | 0 |
| B | 0 | 0 | 1 | 0 | 0 | 0 | 1 |
| C | 0 | 0 | 0 | 1 | 0 | 1 | 0 |
| D | 0 | 0 | 0 | 1 | 0 | 0 | 1 |
| E | 0 | 0 | 0 | 0 | 1 | 0 | 1 |

FIG. 20B (PRIOR ART)

| DATA TO BE CONVERTED (8 BITS) | CONVERTED DATA | | | | | | |
|---|---|---|---|---|---|---|---|
| MSN (MOST SIGNIFICANT 4 BITS) | 4/15 CODE | | | | | | |
| | BIT 2 | 4 | 6 | 8 | 10 | 12 | 14 |
| 0 | 1 | 0 | 0 | 0 | 0 | 0 | 0 |
| 1 | 1 | 0 | 1 | 1 | 0 | 0 | 0 |
| 2 | 1 | 0 | 0 | 0 | 1 | 0 | 0 |
| 3 | 1 | 0 | 0 | 0 | 0 | 1 | 0 |
| 4 | 0 | 1 | 0 | 1 | 0 | 0 | 1 |
| 5 | 0 | 1 | 0 | 0 | 0 | 0 | 0 |
| 6 | 0 | 1 | 0 | 0 | 1 | 1 | 0 |
| 7 | 0 | 0 | 0 | 0 | 0 | 0 | 0 |
| 8 | 0 | 0 | 1 | 0 | 0 | 0 | 1 |
| 9 | 0 | 0 | 1 | 0 | 1 | 0 | 0 |
| A | 0 | 0 | 0 | 0 | 0 | 1 | 0 |
| B | 0 | 0 | 0 | 1 | 0 | 1 | 1 |
| C | 0 | 0 | 0 | 1 | 0 | 0 | 0 |
| D | 0 | 0 | 0 | 0 | 0 | 0 | 1 |
| E | 0 | 0 | 0 | 0 | 1 | 0 | 1 |

FIG. 20C (PRIOR ART)

| DATA TO BE CONVERTED (8 BITS) | | CONVERTED DATA 4/15 CODE | | | | | | | | | | | | | | |
|---|---|---|---|---|---|---|---|---|---|---|---|---|---|---|---|---|
| MSN | LSN | BIT 1 | 2 | 3 | 4 | 5 | 6 | 7 | 8 | 9 | 10 | 11 | 12 | 13 | 14 | 15 |
| 0 | F | 1 | 1 | 1 | 0 | 0 | 0 | 0 | 0 | 0 | 0 | 0 | 0 | 0 | 0 | 0 |
| 1 | F | 1 | 1 | 1 | 0 | 0 | 1 | 0 | 1 | 0 | 0 | 0 | 0 | 0 | 0 | 0 |
| 2 | F | 1 | 1 | 1 | 0 | 0 | 0 | 0 | 0 | 0 | 1 | 0 | 0 | 0 | 0 | 0 |
| 3 | F | 1 | 1 | 1 | 0 | 1 | 0 | 0 | 0 | 0 | 0 | 0 | 1 | 0 | 0 | 0 |
| 4 | F | 1 | 1 | 1 | 1 | 1 | 0 | 0 | 1 | 0 | 0 | 0 | 0 | 0 | 1 | 0 |
| 5 | F | 0 | 0 | 1 | 1 | 1 | 0 | 0 | 0 | 0 | 0 | 0 | 0 | 0 | 0 | 0 |
| 6 | F | 0 | 0 | 1 | 1 | 1 | 0 | 0 | 1 | 0 | 1 | 0 | 0 | 0 | 0 | 0 |
| 7 | F | 0 | 0 | 1 | 1 | 1 | 0 | 0 | 0 | 0 | 0 | 0 | 1 | 0 | 1 | 0 |
| 8 | F | 0 | 0 | 0 | 0 | 1 | 1 | 1 | 0 | 0 | 0 | 0 | 0 | 0 | 0 | 0 |
| 9 | F | 0 | 0 | 0 | 0 | 1 | 1 | 1 | 0 | 1 | 0 | 0 | 0 | 0 | 0 | 0 |
| A | F | 0 | 0 | 0 | 0 | 1 | 1 | 1 | 0 | 0 | 0 | 0 | 0 | 0 | 1 | 0 |
| B | F | 0 | 0 | 0 | 0 | 0 | 0 | 1 | 1 | 1 | 0 | 0 | 1 | 0 | 0 | 0 |
| C | F | 0 | 0 | 0 | 0 | 0 | 0 | 0 | 1 | 1 | 1 | 0 | 0 | 0 | 0 | 0 |
| D | F | 0 | 0 | 0 | 0 | 0 | 0 | 1 | 0 | 1 | 1 | 1 | 0 | 1 | 1 | 0 |
| E | F | 0 | 0 | 0 | 0 | 0 | 0 | 0 | 1 | 1 | 1 | 0 | 0 | 0 | 1 | 0 |
| F | F | 0 | 0 | 0 | 0 | 0 | 0 | 0 | 1 | 0 | 1 | 0 | 0 | 1 | 0 | 0 |

| DATA TO BE CONVERTED (8 BITS) | | ↔ | CONVERTED DATA | | | | | | | | | | | | | | | |
|---|---|---|---|---|---|---|---|---|---|---|---|---|---|---|---|---|---|---|
| MSN | LSN | ↔ | 4 / 15 CODE | | | | | | | | | | | | | | | |
| | | | BIT 1 | 2 | 3 | 4 | 5 | 6 | 7 | 8 | 9 | 10 | 11 | 12 | 13 | 14 | 15 |
| F | 0 | ↕ | 1 | 0 | 0 | 0 | 1 | 1 | 1 | 0 | 0 | 0 | 0 | 0 | 0 | 0 | 0 |
| F | 1 | | 1 | 0 | 0 | 0 | 1 | 1 | 1 | 1 | 0 | 0 | 0 | 0 | 0 | 0 | 0 |
| F | 2 | | 1 | 0 | 0 | 0 | 0 | 0 | 1 | 1 | 1 | 1 | 0 | 0 | 0 | 0 | 0 |
| F | 3 | | 1 | 0 | 0 | 0 | 0 | 0 | 0 | 1 | 0 | 1 | 1 | 0 | 0 | 0 | 0 |
| F | 4 | | 1 | 0 | 0 | 1 | 0 | 0 | 0 | 0 | 0 | 0 | 0 | 1 | 0 | 1 | 0 |
| F | 5 | | 0 | 0 | 1 | 0 | 0 | 0 | 0 | 0 | 1 | 0 | 0 | 0 | 1 | 0 | 0 |
| F | 6 | | 0 | 0 | 1 | 0 | 0 | 0 | 1 | 1 | 0 | 1 | 1 | 0 | 0 | 0 | 0 |
| F | 7 | | 0 | 0 | 1 | 0 | 0 | 0 | 0 | 0 | 0 | 0 | 1 | 1 | 0 | 1 | 0 |
| F | 8 | | 0 | 0 | 0 | 0 | 0 | 1 | 0 | 1 | 1 | 1 | 0 | 0 | 1 | 0 | 0 |
| F | 9 | | 0 | 0 | 0 | 0 | 1 | 0 | 0 | 0 | 0 | 0 | 1 | 1 | 0 | 0 | 0 |
| F | A | | 0 | 0 | 0 | 0 | 1 | 0 | 0 | 0 | 0 | 1 | 0 | 1 | 0 | 1 | 0 |
| F | B | | 0 | 0 | 0 | 0 | 0 | 0 | 0 | 0 | 0 | 0 | 1 | 1 | 1 | 0 | 0 |
| F | C | | 0 | 0 | 0 | 0 | 1 | 0 | 1 | 0 | 0 | 1 | 1 | 1 | 0 | 1 | 0 |
| F | D | | 0 | 0 | 0 | 0 | 0 | 0 | 0 | 0 | 0 | 0 | 1 | 1 | 1 | 0 | 0 |
| F | E | | 0 | 0 | 0 | 0 | 0 | 0 | 0 | 0 | 1 | 0 | 1 | 1 | 1 | 1 | 0 |
| F | F | | 0 | 0 | 0 | 0 | 0 | 0 | 0 | 1 | 1 | 1 | 0 | 0 | 1 | 0 | 0 |

F I G. 20D (PRIOR ART)

| DATA TO BE CONVERTED (8 BITS) | | ↔ | CONVERTED DATA | | | | | | | | | | | | | | | |
|---|---|---|---|---|---|---|---|---|---|---|---|---|---|---|---|---|---|---|
| MSN | LSN | ↔ | 4 / 15 CODE | | | | | | | | | | | | | | | |
| | | | BIT 1 | 2 | 3 | 4 | 5 | 6 | 7 | 8 | 9 | 10 | 11 | 12 | 13 | 14 | 15 |
| 0 | F | ↔ | 0 | 1 | 0 | 0 | 1 | 1 | 1 | 0 | 0 | 0 | 0 | 0 | 0 | 0 | 0 |
| 1 | F | | 0 | 1 | 0 | 0 | 0 | 0 | 1 | 1 | 1 | 0 | 0 | 0 | 0 | 0 | 0 |
| 2 | F | | 0 | 1 | 0 | 0 | 0 | 0 | 0 | 0 | 1 | 1 | 1 | 0 | 0 | 0 | 0 |
| 3 | F | | 0 | 1 | 0 | 0 | 0 | 0 | 0 | 0 | 0 | 0 | 1 | 1 | 1 | 0 | 0 |
| 5 | F | | 0 | 0 | 0 | 1 | 0 | 0 | 1 | 1 | 1 | 0 | 0 | 0 | 0 | 0 | 0 |
| 6 | F | | 0 | 0 | 0 | 1 | 0 | 0 | 0 | 0 | 1 | 1 | 1 | 0 | 0 | 0 | 0 |
| 7 | F | | 0 | 0 | 0 | 1 | 0 | 0 | 0 | 0 | 0 | 0 | 1 | 1 | 1 | 0 | 0 |
| 9 | F | | 0 | 0 | 0 | 0 | 0 | 1 | 0 | 0 | 1 | 1 | 1 | 0 | 0 | 0 | 0 |
| A | F | | 0 | 0 | 0 | 0 | 0 | 1 | 0 | 0 | 0 | 0 | 1 | 1 | 1 | 0 | 0 |
| C | F | | 0 | 0 | 0 | 0 | 0 | 0 | 0 | 1 | 0 | 0 | 1 | 1 | 1 | 0 | 0 |
| F | 5 | | 0 | 1 | 1 | 1 | 0 | 0 | 1 | 0 | 0 | 0 | 0 | 0 | 0 | 0 | 0 |
| F | 6 | | 0 | 1 | 1 | 1 | 0 | 0 | 0 | 0 | 1 | 0 | 0 | 0 | 0 | 0 | 0 |
| F | 7 | | 0 | 1 | 1 | 1 | 0 | 0 | 0 | 0 | 0 | 1 | 0 | 0 | 0 | 0 | 0 |
| F | 8 | | 0 | 1 | 1 | 1 | 0 | 0 | 0 | 0 | 0 | 0 | 0 | 1 | 0 | 0 | 0 |
| F | 9 | | 0 | 0 | 0 | 1 | 1 | 1 | 0 | 0 | 1 | 0 | 0 | 0 | 0 | 0 | 0 |
| F | A | | 0 | 0 | 0 | 1 | 1 | 1 | 0 | 0 | 0 | 0 | 1 | 0 | 0 | 0 | 0 |
| F | B | | 0 | 0 | 0 | 1 | 1 | 1 | 0 | 0 | 0 | 0 | 0 | 1 | 0 | 0 | 0 |
| F | C | | 0 | 0 | 0 | 0 | 0 | 1 | 1 | 1 | 0 | 1 | 0 | 0 | 0 | 0 | 0 |
| F | D | | 0 | 0 | 0 | 0 | 0 | 1 | 1 | 1 | 0 | 0 | 0 | 1 | 0 | 0 | 0 |
| 0 | 0 | | 1 | 1 | 1 | 1 | 0 | 0 | 0 | 0 | 0 | 0 | 0 | 0 | 0 | 0 | 0 |
| 1 | 1 | | 0 | 1 | 1 | 1 | 1 | 0 | 0 | 0 | 0 | 0 | 0 | 0 | 0 | 0 | 0 |
| 2 | 2 | | 0 | 0 | 1 | 1 | 1 | 1 | 0 | 0 | 0 | 0 | 0 | 0 | 0 | 0 | 0 |
| 3 | 3 | | 0 | 0 | 0 | 1 | 1 | 1 | 1 | 0 | 0 | 0 | 0 | 0 | 0 | 0 | 0 |
| 4 | 4 | | 0 | 0 | 0 | 0 | 1 | 1 | 1 | 1 | 0 | 0 | 0 | 0 | 0 | 0 | 0 |
| 5 | 5 | | 0 | 0 | 0 | 0 | 0 | 1 | 1 | 1 | 1 | 0 | 0 | 0 | 0 | 0 | 0 |
| 6 | 6 | | 0 | 0 | 0 | 0 | 0 | 0 | 1 | 1 | 1 | 1 | 0 | 0 | 0 | 0 | 0 |
| 7 | 7 | | 0 | 0 | 0 | 0 | 0 | 0 | 0 | 1 | 1 | 1 | 1 | 0 | 0 | 0 | 0 |
| 8 | 8 | | 0 | 0 | 0 | 0 | 0 | 0 | 0 | 0 | 1 | 1 | 1 | 1 | 0 | 0 | 0 |
| 9 | 9 | | 0 | 0 | 0 | 0 | 0 | 0 | 0 | 0 | 0 | 1 | 1 | 1 | 1 | 0 | 0 |
| A | A | | 0 | 0 | 0 | 0 | 0 | 0 | 0 | 0 | 0 | 0 | 1 | 1 | 1 | 1 | 0 |

FIG. 20E
(PRIOR ART)

| DATA TO BE CONVERTED | | | CONVERTED DATA |
|---|---|---|---|
| DATA (H) | BINARY NOTION | | 4/11 CODE |
| 00 | 00000000 | ↔ | 11010000 1000 |
| 01 | 00000001 | | 11010000 0100 |
| 02 | 00000010 | | 11010000 0010 |
| 03 | 00000011 | | 11010000 0001 |
| 04 | 00000100 | | 11001001 1000 |
| 05 | 00000101 | | 11001000 0100 |
| 06 | 00000110 | | 11001000 0010 |
| 07 | 00000111 | | 11001000 0001 |
| 08 | 00001000 | ↔ | 11000101 1000 |
| 09 | 00001001 | | 11000100 0100 |
| 0A | 00001010 | | 11000100 0010 |
| 0B | 00001011 | | 11000100 0001 |
| 0C | 00001100 | | 11000011 1000 |
| 0D | 00001101 | | 11000010 0100 |
| 0E | 00001110 | | 11000010 0010 |
| 0F | 00001111 | | 11000010 0001 |
| 10 | ---- | | ---- |

FIG. 21
(PRIOR ART)

CODING/DECODING METHOD AND APPARATUS THEREFOR

This application is a continuation, of application Ser. No. 08/027,581 filed Mar. 5, 1993, which was a continuation of appln. Ser. No. 07/504,623, filed Apr. 4, 1990.

BACKGROUND OF THE INVENTION

1. Field of the Invention

This invention relates to a coding/decoding method and apparatus therefor for coding a series of data comprising a series of digital bits in order to record digital data on an optical recording medium such as an optical disk or photomagnetic disk.

2. Description of the Prior Art

Various code converting methods used when recording a digital signal on an optical disk or photomagnetic disk or the like have been developed with the progress that has been made in raising recording density and in peripheral techniques such as PLL. Such coding involves converting binary data that is to be recorded into a binary code word pattern suited to the characteristics of the recording/playback system which includes the recording medium.

One type of optical disk on which writing is performed using coded data coded by such a coding method is a photomagnetic disk. With a photomagnetic disk, data is stored by the orientation of magnetization. Specifically, a magnetized film in which magnetization is oriented perpendicular to the disk surface is used as the recording medium. The magnetized film possesses magnetic retentiveness at ordinary temperatures and therefore the direction of magnetization does not change at such temperatures. When the Curie point is exceeded, however, retentiveness diminishes. Accordingly, a strong magnetic field is externally applied to the magnetized film of the photomagnetic disk, in which state the film is irradiated with a laser beam to suddenly raise the temperature of the irradiated portion. When the temperature of the irradiated portion of the magnetized film is thus made to exceed the Curie point, the magnetized film is magnetized in the direction of the magnetic field to perform the writing of data on the photomagnetic disk. When what has been written on the photomagnetic disk is read out, the disk is irradiated with a laser beam weaker than that used for writing and the angle of the deflection plane of the reflected light is detected, thereby determining the magnetization direction of the magnetized film to decide the data.

A sample/hold method has been proposed as a photomagnetic disk tracking servo method. This method is characterized in that reference is made to clock information independent of the written data and preformatted on the disk at a constant interval, whereby a recording code used when recording data does not require a self-clock characteristic. Conventional examples of such a code are referred to as 4/15 (4-out-of-15) and 4/11 (4-out-of-11) codes.

The 4/15 code is one in which original data comprising eight bits is expressed by setting any four bits in a bit pattern of 15 bits to "1". In other words, among the bits set to "1" in a 4/15 code, two are selected from odd-numbered bits and two are selected from even-numbered bits, and in a case where "1"s do not appear consecutively in one code word, is it so arranged that a minimum of two "0"s are inserted between a "1" and a "1". As a result, a bit pattern in which "101" appears in the bit pattern of 15 bits will not occur. Further, it is so arranged that the 15th bit will always be "0".

FIGS. 20A through 20E show conversion tables of such a 4/15 code. When 8-bit data is expressed as a hexadecimal number in these conversion tables, a conversion to a 4/15 code is made in accordance with the tables of FIGS. 20A and 20B if "F" data is not contained as a hexadecimal number in both the higher order four bits [MSN (most significant nibble)] and the lower order four bits [LSN (least significant nibble)]. If the hexadecimal "F" is contained in either the MSN or LSN, then the 8-bit data is converted into 15-bit data in accordance with the conversion tables of FIGS. 20C and 20D.

FIG. 20E shows another conversion rule of the 4/15 code which differs from the rules mentioned above. The 30 code words shown in FIG. 20E are used in special applications, such as for synchronization.

Similarly, the 4/11 code is one in which original data comprising eight bits is expressed by a bit pattern in which any four bits among 11 bits is "1". Part of an example of such a conversion table is shown in FIG. 21.

The characteristics required for such a recording code are as follows:

(1) Minimum magnetization reversal (bit) interval $T_{min}$

Preferably, $T_{min}$ is as large as possible to reduce susceptibility to the effects of band limitations in the recording/playback system. If the same degree of waveform interference is allowed, high density recording is possible with the code having the large $T_{min}$.

(2) Maximum magnetization reversal (bit) interval $T_{max}$

In order to obtain a self-clock function, $T_{max}$ preferably is a small value so as to enable clock information to be extracted from playback data.

(3) Detection window width $T_W$

This represents degree of margin with respect to time-axis fluctuation such as peak shift due to playback signal jitter or waveform interference. It is preferred that $T_W$ have a large value.

There is also an evaluation approach from (1) and (3) in which a large value for $T_{min} \times T_W$ is deemed desirable.

Further, $T_{max}/T_{min}$ is a parameter which indicates the spread of the signal waveform band. It is preferred that this value be small.

When m-bit data is converted into an n-bit code word in each of the above characteristics, and letting d represent the minimum value and k the maximum value of the run number which is the number of "0"s between "1"s in the code word, a code word in which the value of k is the limit is especially referred to as a run-length limited (RLL) code. In the case of a variable-length code word in which a data word of r·m-bits is converted into a code word of r·n bits, the code is referred to as a (d,k; m,n; $r_{max}$) code wherein the maximum value of r is $r_{max}$. Here m shall be referred to as basic data word length and n as basic code word length. In case of a fixed-length code, the code is indicated with $r_{max}$ being deleted.

$T_{max}$, $T_{min}$, $T_W$ are expressed as follows using d and k:

$T_{min} = (d+1) \cdot T_W$ $T_{max} = (k+1) \cdot T_W$ $T_W = (m/n) \cdot T$ (T: one-bit length of data word)

More specifically, it will be understood that d (the minimum value of the run number of "0"s in the code word) should be enlarged in order to enlarge $T_{min}$, k (the maximum value of the run number of "0"s in the code word) should be reduced in order to reduce $T_{max}$, and the code word length (n) should be reduced in order to enlarge the detection window width $T_W$.

In general, in case of a variable code length, a bit error propagates to an ensuing block and word synchronism is lost. Therefore, a word boundary which is easy to locate is an important point in a code word in order to rapidly recover from such a deviation in synchronism.

In the above-described sample/hold method, the clock information is obtained independently of data and the self-clock characteristic is not required of the recording code. Therefore, it can be considered that the limit on higher recording density is decided by waveform interference at the time of playback.

When considering connecting code words following conversion in the case of the conventional 4/15 code or 4/11 code described above, it is found that the minimum value d of the number of "0"s between two "1"s in either code is d =1. The minimum bit interval $T_{min}$ is $T_{min}$=1.07 in the 4/15 code and $T_{min}$=1.45 in the 4/11 code.

However, it has become necessary to raise recording density and to have a large code of the minimum bit interval $T_{min}$.

Since the 4/15 code and 4/11 code involve large conversion units, both are disadvantageous in that the ROM capacity used in the conversion circuit and reverse-conversion circuit is large.

Various code conversion methods have heretofore been proposed in view of the foregoing. Typical examples which can be mentioned are MFM, (2, 7) RLL, etc. These are code conversion methods having the features described below. For the sake of convenience, hereinafter codes will be represented upon being normalized at T, and the correspondence between data word and code word is shown in FIG. 4. FIG. 4A shows the correspondence between data word and code word of (2, 7) RLL code, and FIG. 4B shows the correspondence between data word and code word of MFM code. In the latter, X indicates the complement on the preceding bit.

In the (2, 7) RLL code of FIG. 4A, m=1 and n=2. Therefore, (a) (2, 7) RLL (d=2, k=7)
 $T_{min}$=1.5
 $T_{max}$=4.0
 $T_W$=0.5
 $T_{min} \times T_W$=0.75
 $T_{max}/T_{min}$=2.67

In the MFM code of FIG. 4B, m=1 and n=2. Therefore, (b) MFM (d=1, k=3)
 $T_{min}$=1.0
 $T_{max}$=2.0
 $T_W$=0.5
 $T_{min} \times T_W$=0.5
 $T_{max}/T_{min}$=2.0

However, in order to obtain a higher recording density and higher data transmission speed, a larger minimum magnetization reversal interval $T_{min}$ or a larger $T_{min} \times T_W$ and a smaller error propagation, a code conversion method having a word boundary which is easy to find is required.

In addition, a code conversion method is necessary in which the detection window $T_W$ is large to detect data with a low error rate and $T_{max}$ is small to obtain a stable clock.

SUMMARY OF THE INVENTION

An object of the present invention is to provide a coding method and apparatus therefor being non-affected by time-axis fluctuation in high-density digital recording and high-speed transmission.

According to the present invention, the foregoing object is attained by providing a coding method comprising steps of; inputting a data word of m×r bits; and converting said data word of m×r bits into a code word of n×r bits (m<n), wherein basic data word length m is two bits, basic code word length n is five bits and number r satisfies the relation $1 \leq r \leq 4$, the converting step includes a coding step that encodes in such a manner that a run number of "0"s between a "1" and a "1" of a binary code bit series in said code words is greater than four and less than 19.

In accordance with another aspect of the present invention, the foregoing object is attained by providing a coding method comprising steps of; inputting a data word of m×r bits; and converting said data word of m×r bits into a code word of n×r bits (m<n), wherein basic data word length m is three bits, basic code word length n is five bits and number r satisfies the relation $1 \leq r \leq 2$, the converting step includes a coding step that encodes in such a manner that a run number of "0"s between a "1" and a "1" of a binary code bit series in said code words is greater than one and less than five.

The above object is attained by providing an apparatus for practicing the above-described method.

Another object of the present invention is to provide a coding method and apparatus therefor capable of reducing waveform interference and of realizing coding in which there is quick recovery from a deviation in word synchronism in high-density digital recording and high-speed transmission.

A further object of the present invention is to provide a coding/decoding method and apparatus therefor capable of reducing waveform interference and of realizing coding in which there is quick recovery from a deviation in word synchronism in high-density digital recording and high-speed transmission.

The above object is attained by providing an apparatus for practicing the above-described method.

The arrangement is such that among these code words, the lower order five bits of the code word of r>1 are "00000".

In accordance with another aspect of the present invention, there is provided a digital signal coding method comprising steps of; inputting a data word of m×r bits; and converting said data word of m×r bits into a code word of n×r bits, where basic data word length m of the digital signal is two bits, basic code word length n is five bits and r is an integer; said converting step includes a coding step that encodes in such a manner that a run length of "0"s between a "1" and a"1" of a binary code word pattern obtained by interconnecting said code words following conversion is greater than 4, and said r satisfies the relation $1 \leq r \leq 3$.

The lower order two bits of all of these code words are "00".

Thus, an object of the present invention is to provide a coding/decoding method and apparatus therefor in which all of the code words are such that the last five bits or last two bits are "0"s, and these are utilized to enable a rapid recovery from a ease where word synchronism is lost due to coding or error generation.

Furthermore, the present invention provides a coding method and apparatus therefore in which the minimum bit interval $T_{min}$ is 2.0 and recording can be performed at a density that is 2.0/1.45=1.38 times higher than with the conventional 4/11 code.

In order to solve the foregoing object, the present invention provides a decoding apparatus for decoding a code word coded in such a manner that a data word of 2×r bits is converted into a code word of 5×r bits, where is an integer, and such that a run length of "0"s between a "1" and a "1" of a binary code word pattern obtained by interconnecting the code words following conversion is greater than 4, and r satisfies the relation $1 \leq r \leq 3$, comprising memory means for inputting and storing the code words in units of 5×r bits, and decoding means for decoding the code words in accordance with the following logical expressions:

$Y_1 = X_{13} + X_{14} \cdot (X_{19} + X_{20}) + \overline{X_9} \cdot \overline{X_{10}} \cdot X_{15} + \overline{X_9} \cdot \overline{X_{10}} \cdot \overline{X_{11}} \cdot \overline{X_{12}} \cdot \overline{X_{13}} \cdot \overline{X_{14}} + (X_4 + X_5) \cdot X_{10} \cdot \overline{X_{15}}$ $Y_2 = X_{12} + X_{13} + X_{14} + X_4 \cdot (X_9 \cdot \overline{X_{14}} + X_{10}) \cdot \overline{X_{15}}$ where $X_1 - X_{20}$ represent the bit series of the code words stored in the memory means, $Y_1, Y_2$ represent the bit series of the decoded data words, and $\overline{X}$ indicates the inverted value of a bit.

Further, the present invention provides a coding/decoding apparatus which, owing to small conversion units, is capable of being constructed of gate circuitry without it being necessary to use a large-capacity ROM.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 2 is an example of a block diagram of a decoding circuit according to an embodiment;

FIG. 3 is a diagram showing the correspondence between data words and code words of a first embodiment;

FIG. 4A is a diagram showing the correspondence between (2, 7) RLL data words and code words;

FIG. 4B is a diagram showing the correspondence between MFM data words and code words;

FIG. 5 is a diagram showing the correspondence between bit patterns of a basic code word (five bits) and symbols used in the description of this specification;

FIG. 9 is a diagram showing the correspondence between data words and code words in a second embodiment;

FIG. 10 is a diagram showing the correspondence between bit patterns of a data word (three bits) of the second embodiment and symbols used in the description of this specification;

FIG. 11 is a diagram showing an example of 5-bit code word patterns which satisfy d=1, k=5 in a second embodiment;

FIG. 12 is a diagram showing an example in which code words ending in "0" are extracted from FIG. 11;

FIG. 13 is diagram showing an example of code words which take into account code words connected from the code words of FIG. 12;

FIGS. 14 and 15 are diagrams showing the correspondence between data words and code words in third and fourth embodiments of the present invention;

FIGS. 20A through 20E are diagrams showing conversion tables of a 4/15 code according to an example of the prior art; and FIG. 21 is a diagram showing an example of a 4/11 code conversion table according to an example of the prior art.

DESCRIPTION OF THE PREFERRED EMBODIMENTS

Preferred embodiments of the present invention will now be described in detail with reference to the accompanying drawings.

The requirements for enabling use as a code word in a code of variable length are three in number, as follows:

(1) the (d,k) limit is satisfied within one code word;

(2) the (d,k) limit is satisfied even when code words are connected together; and (3) the boundary of a code word can be accurately judged and it is possible to uniquely decode the code word.

Accordingly, the coding apparatus of this embodiment is assumed to be one which executes coding satisfying the foregoing requirements.

[Description of Coding Circuit (FIGS. 1 and 2)]

Figure 1:
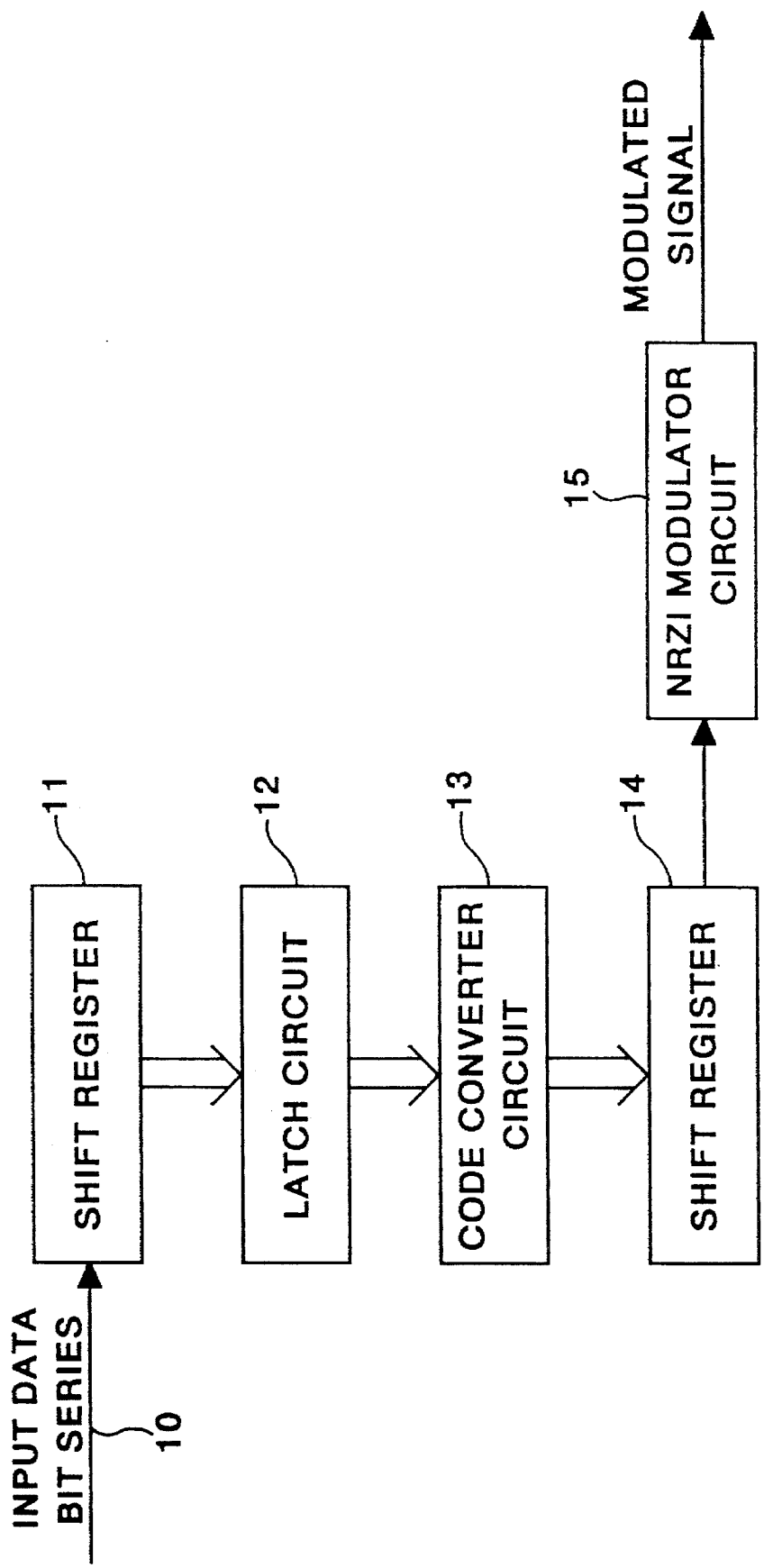
FIG. 1 is an example of a block diagram of a coding circuit according to an embodiment.

FIG. 1 is a block diagram illustrating an example of a coding circuit for realizing coding of a first embodiment according to the present invention.

An input data bit series 10 is accepted by an 8-bit shift register 11 and sent to a latch circuit 12 in 8-bit units. This 8-bit data is further sent to a code converting circuit 13 to be converted into a code. When the 2r ($1 \leq r \leq 4$) bits from the beginning of the eight bits are equal to any of the 2r-bit data words of FIG. 3, the corresponding code word is sent to a shift register 14 (a parallel-series converter circuit). In this case matching is achieved in the code converting circuit 13 giving priority to the larger data word lengths. In other words, initially it is determined whether there is agreement with a data word of eight bits, which is the maximum word length, then it is determined whether there is agreement with a data word of six bits, next a data word of four bits, and finally a data word or two bits. When data word matching is thus achieved, the corresponding code word is decided in accordance with, e.g., FIG. 3, and a conversion is made to the code word.

The code word resulting from such a code conversion is subjected to a serial conversion by the shift register 14, after which it is sent to an NRZI modulator circuit 15 to be subjected to NRZI modulation. Thereafter, and in similar fashion, the input data series 10 is accepted by the shift register 11 in an amount equivalent to the number of bits in the bit series of the matched data words, and the above-described operation is executed repeatedly. It should be noted that the code converting circuit 13 mentioned above can be simply fabricated by a look-up table constituted by a ROM or gate circuit, etc.

FIG. 2 shows an example of a decoding circuit for decoding the signal coded by the coding circuit illustrated in FIG. 1.

An input code word bit series 20 is accepted by a 20-bit (r=4) shift register 21, after which it is sent to a latch circuit 22. The 20 bits are sent to a code reverse-converter circuit 23. When 5r (1≦r≦4) bits from the beginning of the 20 bits are equal to any code word of 5r bits in FIG. 3, the corresponding data word is sent to a shift register 24 by the code reverse-converter (decoder) circuit 23. In this case, matching is achieved giving priority to the larger code word lengths. In other words, initially it is determined whether there is agreement with a code word of 20 bits, then it is determined whether there is agreement with a code word of 15 bits, next a data word of ten bits, and finally a data word or five bits.

Thus, if equality is established with any of the code words of FIG. 3, the corresponding data word is sent to the shift register 24 and the data word is converted from parallel data to serial data. Whenever a code word of 5r bits is thus decoded, the input code series 20 is accepted by the shift register 21 in an amount equivalent to the number of bits of the matched code word, decoding is performed as described above, and the above-described operation is repeated.

Though not specifically shown in the drawings, a synchronism sensing circuit is provided and utilizes the fact that the last five bits of the 10-bit, 15-bit and 20-bit code words are all "0" (see FIG. 3). In a case where word synchronism is lost, the end of the code word is sensed by searching for the 5-bit "0" series, thus making it possible to restore word synchronism.

The coding method performed by the coding apparatus of the embodiment will now be described in detail.

Described first will be a method of constructing a variable-length code which satisfies the foregoing requirements, wherein basic data word length m=2 bits, basic code word length n=5 bits, code word length number $r_{max}$=4, d=4, k=19. For the sake of the description, a code word satisfying requirement (1) shall be referred to as a (d,k) limit code word, a code word satisfying requirements (1) and (2) shall be referred to as an effective code word, and a code word satisfying all of the requirements (1) through (3) shall be referred to as a unique code word.

FIG. 5 illustrates six 5-bit basic code words satisfying d=4, k=19. A 10-bit (d,k) limit code word is obtained by so combining two basic code words as to satisfy the (d,k) limitation. More specifically, the 10-bit (d,k) limit code word is obtained by combining and connecting the basic code words indicated by the O marks in FIG. 6. In addition, a 15-bit (d,k) limit code word is obtained by combining three basic code words, and a 20-bit (d,k) limit code word is obtained by combining four basic code words.

Figures 6, 7, 8:
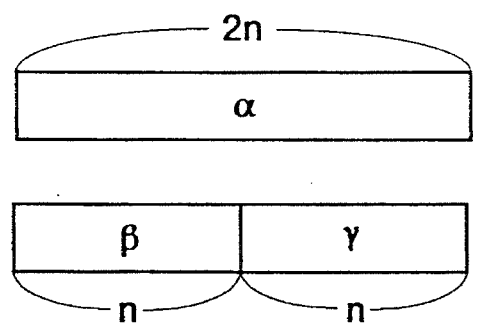
FIG. 6 is a showing diagram combinations of basic code words capable of being connected.
FIG. 7 is a diagram for describing combinations of code words that are not unique.
FIG. 8 is a diagram showing the correspondence between bit patterns of a basic data word (five bits) and symbols used in the description of this specification.

In order for these (d,k) limit code words to satisfy requirement (2), it will suffice if the first five bits of the succeeding code word satisfies the combinations of FIG. 6 with respect to the last five bits of the preceding code word in such a manner that the number of consecutive "0"s in the code word is four or less. In other words, it is necessary to modify the succeeding code word by the preceding code word. A pattern in which all bits are "0"s cannot be used as a code word because of the k limitation.

A rule for selecting a unique code word will now be described.

In a case where a 2n-bit code word α is equal to one obtained by connecting n-bit code words β and γ, as shown in FIG. 7, such a code word cannot be uniquely decoded. Accordingly, the code word is not a unique code word and cannot be employed as a code word pattern. In general, an r·n-bit unique code word is obtained by excluding, from an r·n-bit effective code word, an r·n-bit effective code word obtained by connecting together unique code words smaller than r·n bits.

For the convenience of description, it will be assumed that a 2-bit data word pattern is A, B, C, D, as shown in FIG. 8, by way of example, where the way in which A, B, C, D are made to correspond with respective ones of the data words "00", "01", "10", "11" is arbitrary. The basic code word pattern also is assumed to be a, b, c, d, e, f, as shown in FIG. 5.

In case of r=1, the data word is 2 (2r) bits. Therefore, the required 5-bit unique code word numbers (hereinafter referred to as "required word numbers") are of four types. Five-bit (basic) code words are assigned to these as shown in FIG. 3.

[Description of Coding in First Embodiment (FIGS. 3, 6, 8)]

Here basic code words a, b, c, d (FIG. 5) are assigned to respective ones of data words A, B, C, D (FIG. 8).

As evident from FIG. 6, the only basic code word pattern that can be taken as the first five bits of a succeeding code word is a (f is omitted because codes comprising all "0"s are excluded). Accordingly, the combination of the data word A and code word a can be utilized independently (data words AA, AB, AC, AD, AAA, ABC, etc). In case of basic code words other than these, different code words are made to correspond by the preceding data.

More specifically, in case of a 4-bit data word BA, a basic code word a cannot be connected to the end of a basic code word b, as shown in FIG. 6. Therefore, a 10-bit code word af is made to correspond, with r=2 being adopted. Similarly, since basic code words a and b cannot be connected to the end of a basic code word c, bf and cf are made to correspond to data words CA and CB, respectively. Further, since basic code words a, b and c cannot be connected to the end of a basic code word d, 10-bit code words must be made to correspond to data words DA, DB and DC, respectively. Here, however, df is made to correspond to DA and ef is made to correspond to DB.

In case of data word DC, data words (DCA, DCB, DCC, DCD) having a total of six bits obtained by adding on two bits are adopted, and 15-bit code words are made to correspond to respective ones of these data words, with r=3.

Since a code word af (data word BA) cannot be connected to the end of any of the basic code words b, c, d, 15-bit code words must be assigned also to the corresponding data words DBA, CBA, BBA. However, since data words CB, DB have already been assigned to 10-bit code words, a 15-bit code word aff is assigned only to data word BBA. Thereafter, and in similar fashion, basic code words are assigned to each data word as shown in FIG. 3.

The final r=4 code word is put into a combination which will satisfy the requirement k=19 even when the basic code word e arrives next. Further, the correspondence between r=2 data words DA, DB and r=3 data words DCB, DCC, DCD and the code words can be interchanged. In addition, the correspondence between three r=4 data words and code words is arbitrary.

Furthermore, by way of example, if df is made to correspond to a data word DA and ef is made to correspond to a data word DC at r=2, the first four bits of the r=3 data word can be changed from DC to DB in FIG. 3; i.e., DCA, DCB, DCC, DCD can be changed to DBA, DBB, DBC, DBD, respectively, and a correspondence table (an example of a modification of FIG. 3) in which an r=4 data word DDCA is changed to a data word DDCB is obtained. However, all of these are stipulated as the same codes using the code word patterns of the present embodiment.

In accordance with the first embodiment as described above, a succeeding code word is changed in correspondence with a preceding code word, thereby limiting the run number of "0"s between a "1" and a "1" and enabling selection of a code word capable of being uniquely coded. In comparison with the conventional (2, 7) RLL code, the code word thus obtained has a $T_{min}$ which is about 33% larger and a $T_{min} \times T_W$ which is approximately 6.7% larger.

By selecting a code word in which the last five bits are all "0"s, it is easier to restore word synchronization if such synchronization is lost. As a result, waveform interference can be reduced in high-density digital recording or high-speed transmission. The practical advantages of this are great.

[Description of Second Embodiment (FIGS. 9–13)]

Described next as a second embodiment will be a method of constructing a variable-length code in which basic data word length m=3 bits, basic code word length n=5 -bits, code word length number $r_{max}$=2, d=1, k=5. For the sake of the description, a code word satisfying requirement (1) shall be referred to as a (d,k) limit code word, a code word satisfying requirements (1) and (2) shall be referred to as an effective code word, and a code word satisfying all of the requirements (1) through (3) shall be referred to as a unique code word.

Here the pattern of a 3-bit data word will be assumed to be as shown at A through H in FIG. 10. The correspondence between the symbols A–H and the bit patterns of the three bits is arbitrary.

FIG. 11 illustrates examples of patterns of 13 code words comprising five bits satisfying d=1, k=5. Eight patterns are selected from these 13 patterns and are made to correspond to data words (A–H). Among the code words shown in FIG. 11, there are eight in which the last bit is "1". Therefore, when data words are made to correspond to these, the result is as shown in FIG. 12. Next, in order to make the k limitation "5", code words which differ depending upon one bit at the beginning of the succeeding code word are assigned to the data words A, B, C, E. The code words thus formed are shown in FIG. 13. Here X represents the complement on one bit at the beginning of the succeeding code word. Since d=1 as things stand, a data word of three consecutive bits is considered to be a 6-bit data word with respect to combinations (HA, HE, HF) of data words wherein d<1 holds by making the connections in FIG. 13, and a 10-bit code word is made to correspond to this data word. Thus, the coded codes shown in FIG. 9 are obtained.

The operation of the coding circuit of FIG. 1 will now be described for this case.

The input data bit series 10 is inputted to the shift register 11, just as described earlier. Here, however, the shift register 11 is a 6-bit shift register. The data resulting from the serial-to-parallel conversion performed by the shift register 11 is sent to the code converting circuit 13 through the latch circuit 12. When the 3r (1≦r≦ 2) bits from the beginning of the six bits are equal to any of the 3r-bit data words of FIG. 9, a conversion is made to the corresponding code word, which is sent to the shift register 14. As in the case of the foregoing embodiment, comparison is made giving priority to the larger data word lengths.

In this case, changing the outputted code word by the succeeding code word can be performed by previously storing the combinations thereof as a look-up table in a ROM or the like. After output, the change can be made upon detecting the patterns which break the d limit. A code word thus coded and converted into serial data by the shift register 14 is outputted upon being subjected to NRZI modulation by the NRZI modulator circuit 15.

Furthermore, in the decoding circuit of FIG. 2, the code reverse-converting circuit 23 receives the coded 10-bit data from the latch circuit 22. When 5r (1≦r≦2) bits from the beginning of the word are equal to any of the 5r-bit code words of FIG. 9, the circuit 23 outputs the corresponding data words (of three or six bits) to the shift register 24. In this case also, just as described earlier, comparison is performed in order giving priority to the larger code word lengths. In other words, first it is determined whether there is agreement with a 10-bit code word. If the ten bits do not agree, then a comparison is made with 5-bit code words.

In accordance with the second embodiment as described above, the "0" run number is made greater than one and less than five, whereby a code word corresponding to a data word is changed by the succeeding code word and the converted bit length is changed. As a result, in comparison with the conventional (2,7) RLL code, a code is obtained in which $T_W$ is about 20% larger and $T_{max}$ about 10% smaller. Further, $T_{min}$=1.20, $T_{max}$=3.60, $T_W$=0.60, $T_{max}/T_{min}$=0.30. As a result, the influence of time-axis fluctuation can be reduced in high-density digital recording or high-speed transmission.

[Third Embodiment]

Described next will be a coding method and apparatus using a variable-length code with no k limit (a limit on the maximum value k of the number of "0"s between a "1" and a "1").

In a variable-length code with no k limit, the requirements for enabling use as a code word are as follows:

(1) the d limit is satisfied within one code word;

(2) the d limit is satisfied even when code words are connected together; and (3) the boundary of a code word can be correctly discriminated and the code word is capable of being uniquely decoded.

Described next will be a method of constructing a variable-length code which satisfies the foregoing requirements, wherein basic data word length m=2 bits, basic code word length n=5 bits, code word length number $r_{max}$=3, and d=4 for the minimum value of the run number of "0"s.

For the sake of the description, a code word satisfying requirement (1) shall be referred to as a d limit code word, a code word satisfying requirements (1) and (2) shall be referred to as an effective code word, and a code word satisfying all of the requirements (1) through (3) shall be referred to as a unique code word.

Basic code words of five bits that satisfy the condition d=4, namely in which there are at least four "0"s between a "1" and a "1", are the abovementioned six code words a–f shown in FIG. 5, by way of example. A 10-bit d (d=4) limit code word is obtained by combining and connecting two of the basic code words a–f of FIG. 5 so as to satisfy the d limit, i.e., by combining and connecting the basic code words indicated by the O marks in FIG. 6. Similarly, a d-limit code word of 15 bits is obtained by connecting three of the basic code words a–f. In order for these d-limit code words to satisfy condition (2), it will suffice if the first five bits of the connected code word satisfy the combinations of FIG. 6 with respect to the last five bits of the preceding code word. That is, it is necessary to change the succeeding code word by the preceding code word. Since a k limit does not exist here, the pattern can be used as a code word even if the pattern is one in which all bits are "0"s.

A rule for selecting the above-described unique code word will now be described.

In case of a pattern in which a 2n-bit code word α is equal to one obtained by connecting n-bit code words β and γ, as shown in FIG. 7, the two cannot be distinguished from each other. Consequently, a γ·n-bit unique code word is obtained by excluding, from a γ·n-bit effective code word, a γ·n-bit effective code word obtained by connecting together unique code words smaller than γ·n bits. This is the same as in the first embodiment.

It will be assumed that a 2-bit data word pattern is A="00", B="01", C="11", D="10", as shown in FIG. 8, where the way in which A, B, C, D are made to correspond with respective ones of the data words "00", "01", "10", "11" is arbitrary. The basic code word pattern also is assumed to be a, b, c, d, e, f, as shown in FIG. 5.

In case of γ=1, the data words A–D are of two bits. Accordingly, there are considered to be four types of patterns, and the required 5-bit unique code word numbers (hereinafter referred to as "required word numbers") are four in number. The (basic) code words a–f of FIG. 5 are assigned as code words resulting from conversion of the data words A–D, as shown in FIG. 14.

Since a self-clock characteristic is not required in a sample/hold system, an all "0" pattern such as f in FIG. 5 also can be used as an independent code word. As will be understood from FIG. 6, the basic code word patterns that can be taken as the first five bits of a succeeding code word are a and f. Accordingly, the combination of the data A and code word a, and the combination of the data D and code word f, can be utilized independently. In case of basic code words other than these, it is necessary for different code words to be made to correspond by the preceding data.

Since is it understood from FIG. 6 that a basic code word that cannot be connected to the end of the basic code word b is a, code words b, a cannot be used with regard to the data word BA. In this case, r=2 and a 10-bit code word df is made to correspond to the 4-bit data word BA. Similarly, since a and b cannot be connected to the basic code word c, the code word ef rather than ca is made to correspond to the data word CA, by way of example.

Since all 10-bit code words other than df, ef are represented by 5-bit code words, these cannot be used in order to satisfy requirement (3), namely the requirement that the code word be uniquely decodable. Accordingly, the data word CB is such that γ=3, and code words are assigned to the 6-bit data words CBA, CBB, CBC, CBD. Here, with regard to CBA, code words c and df are already capable of being connected, as mentioned earlier. Therefore, it is unnecessary to assign them beforehand. The unique 15-bit code words are exactly three in number, and these are assigned. At γ=3, the assignment of data words and code words is arbitrary. FIG. 14 is a data word/code word conversion table. Conversion is performed giving precedence to the larger word lengths, as will be understood from the foregoing discussion.

An example of a recording coding/decoding circuit will now be described.

Figure 16:
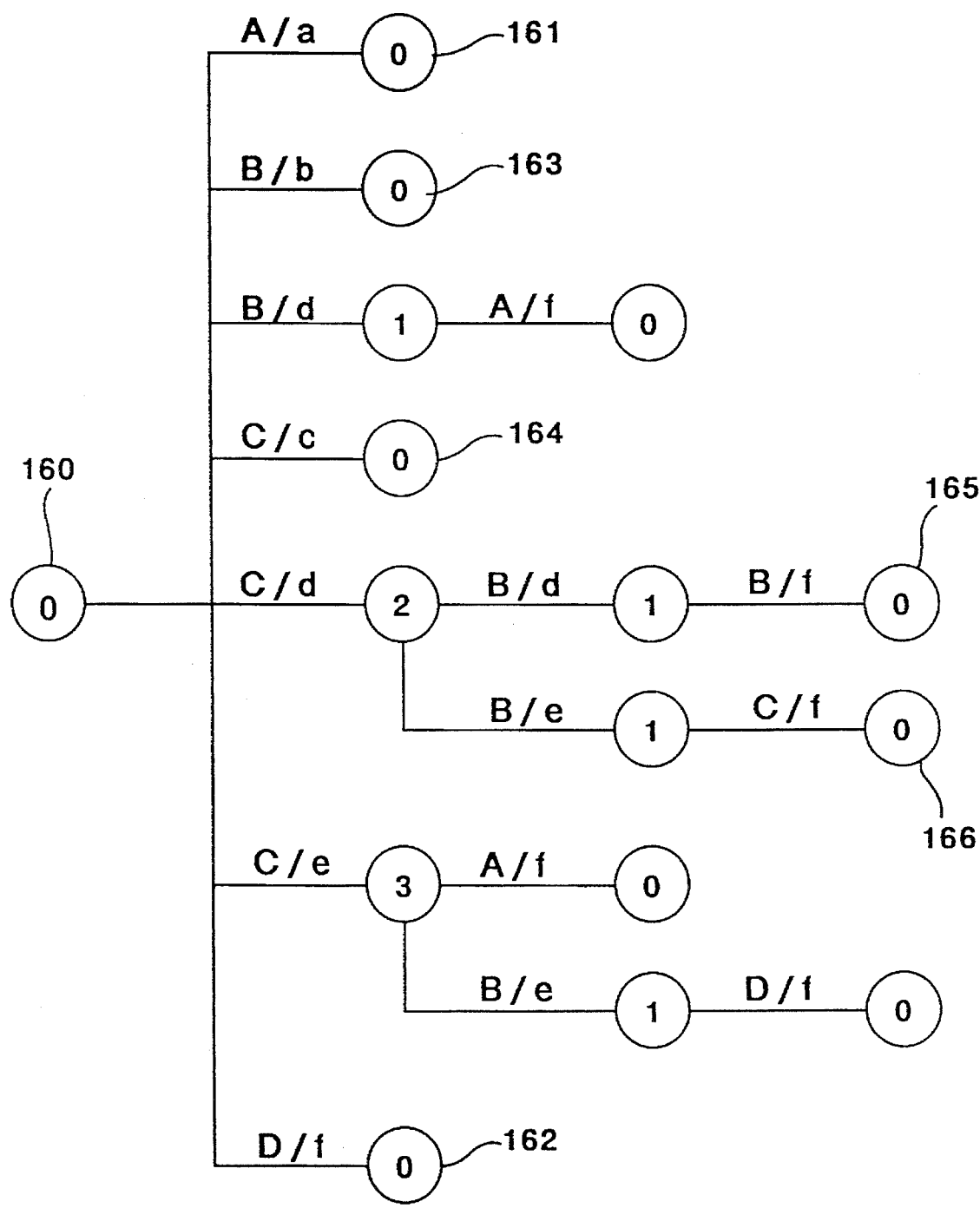
FIGS. 16 and 17 are diagram showing a coding/decoding tree of FIGS. 14 and 15, respectively.

FIG. 16 illustrates a coding/decoding tree based on the data word/code word conversion table shown in FIG. 14. FIG. 16 will be described in simple terms.

In FIG. 16, the numerals within the circles indicate coders or decoders the initial stated of which is represented by ⓪ (160). With regard to data words A, D, these are uniquely converted into code words a, f, respectively, the states whereof shift to ⓪ (161, 162), respectively. The data word B is converted into a code word d when the succeeding data word is A, and into a code word b at all other times, and the states thereof shift to ①, ⓪, (163), respectively.

The data word C requires that the succeeding data word (four bits) be checked. When the succeeding data word is other than A, BB, BC, BD shown in FIG. 14, the data word C is converted into c, and the state shifts to ⓪ (164). When the succeeding data word is A, BD, the data word C is converted into code word e and the respective states shift to ②, ③. Further, at state ②, a code word d is outputted with respect to the data word B when the succeeding data word is BB and a code word e is outputted with respect to the data word B when the succeeding data word is BC, with the state then shifting to ①. When the data word is BB from state ①, the succeeding data word B is converted into f and outputted; when the data word is BC, the succeeding data word C is converted into f and outputted. The respective states shift to ⓪ (165, 166). The same is true with regard to other states.

Figure 17:
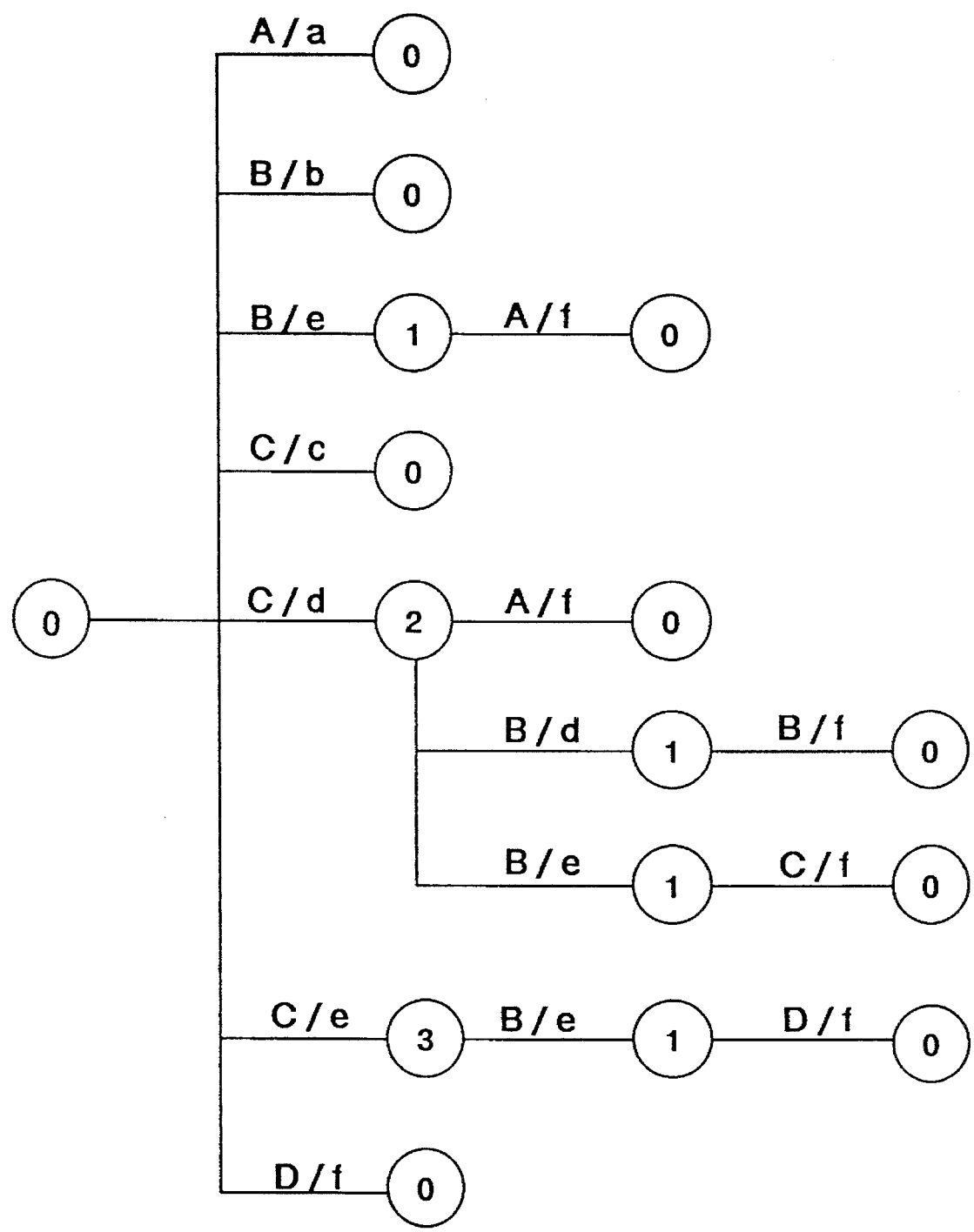

FIG. 17 illustrates a coding/decoding tree based on the data word/code word conversion table shown in FIG. 15. Code words are decided with regard to data words just as in the case of FIG. 16 described above.

Figure 18:
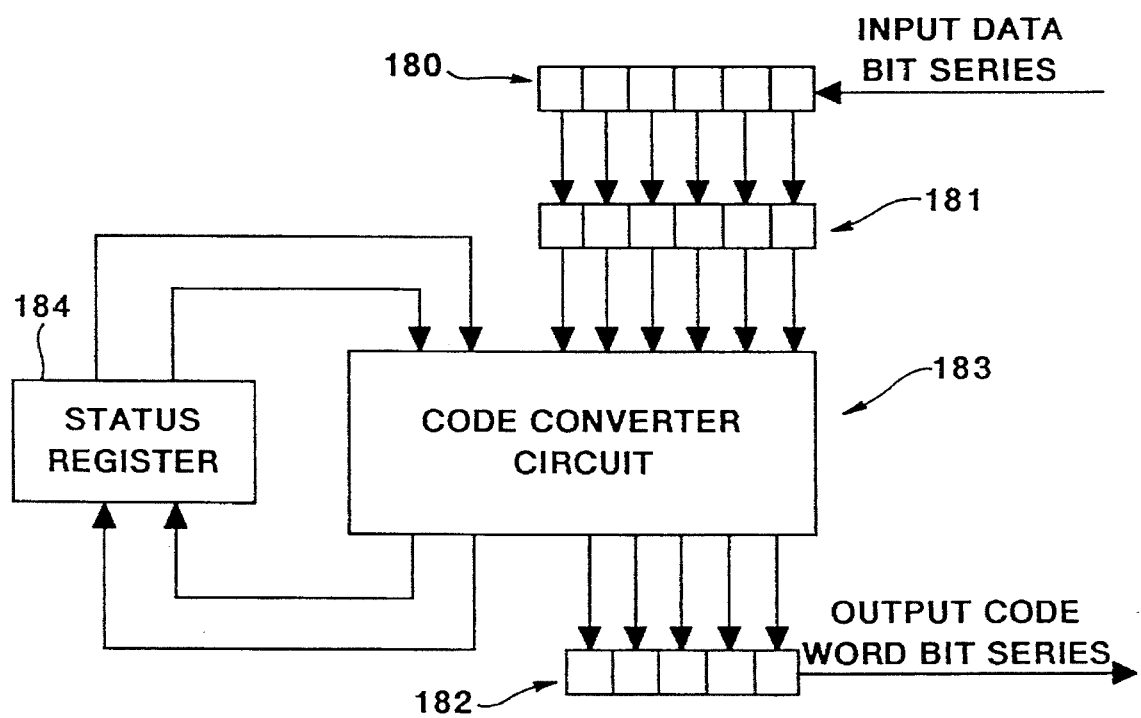
FIG. 18 is a block diagram showing an example of a coding circuit according to the third and fourth embodiment.

FIG. 18 is a block diagram showing an example of a coding circuit for realizing this operation.

In FIG. 18, an input data bit series is accepted by a 6-bit shift register (a parallel/serial converter circuit) 180 and is latched in a latch circuit 181 every two bits. These six bits are sent to a code converting circuit 183. Based on the 6-bit input from the latch circuit 181 and a 2-bit input from a status register 184, the code converting circuit 183 outputs a 5-bit code word to a shift register (a parallel/serial converter circuit) 182 and outputs two bits, which are indicative of status following a transition, to the status register 184. The code word thus serially converted is sent from the shift register 182 to the NRZI modulator circuit 15 (see FIG. 1) to undergo NRZI modulation.

Decoding processing also is executed based on the coding/decoding tree of FIG. 16. It should be noted that since an optical disk has many errors at the time of detection, it is important to adopt a decoding method in which the error propagation is small.

Figure 19:
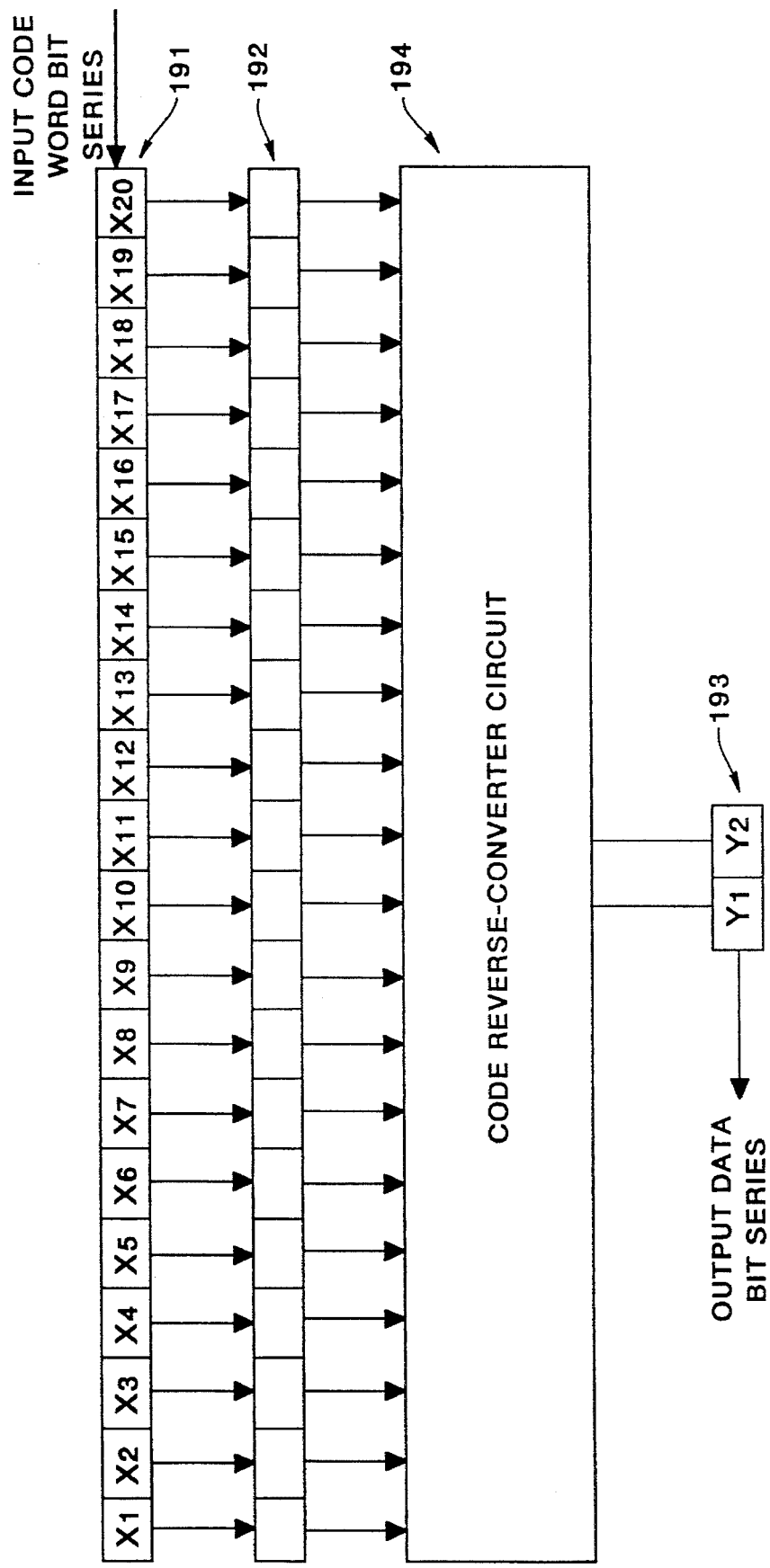
FIG. 19 is a block diagram showing an example of a decoding circuit according to the third and fourth embodiment.

FIG. 19 is a block diagram showing the construction of a decoding circuit for effecting a conversion from a code word to a data word.

In FIG. 19, processing performed by a code reverse-converting circuit 194 can be expressed by the following logical expressions, where the input code word bit series is $X_1$–$X_{20}$ and the reverse-converted output data bit series is $Y_1$–$Y_2$:

$Y_1 = X_{13} + X_{14} \cdot (X_{19} + X_{20}) + \overline{X_9} \cdot \overline{X_{10}} \cdot X_{15} + \overline{X_9} \cdot \overline{X_{10}} \cdot \overline{X_{11}} \cdot \overline{X_{12}} \cdot \overline{X_{13}} \cdot \overline{X_{14}} + (X_4 + X_5) \cdot X_{10} \cdot \overline{X_{15}}$ $Y_2 = X_{12} + X_{13} + X_{14} + X_{15} + X_4 \cdot (X_9 \cdot \overline{X_{14}} + X_{10}) \cdot \overline{X_{15}}$ In the foregoing, $\overline{X}$ is the inverted value of a bit.

The pattern assignment of the data words Y1, Y2 is as follows:

| (Y₂Y₁) |
| --- |
| A → 0 0 |
| B → 0 1 |
| C → 1 1 |
| D → 1 0 |

All of the code words shown in FIG. 14 have "0"s as their last two bits. By utilizing this, it is possible to achieve rapid recovery from a case where word synchronism is lost due to decoding or the occurrence of an error.

The outputted two-bit data word is transmitted upon being serially converted.

[Fourth Embodiment]

In the foregoing embodiment, the code word df was made to correspond to the data word BA and the code word ef was made to correspond to the data word CA at $\gamma=2$. However, recording codes having the same features can be formed even if the code word ef is made to correspond to the data word BA and the code word df is made to correspond to the data word CA, as shown in FIG. 15. In addition, assignments are made just as in the case of $\gamma=3$. Such a conversion table is shown in FIG. 15, and the coding/decoding tree in such case is as shown in FIG. 17, as described above. The block diagrams of the coding circuit and decoding circuit are the same as in the foregoing embodiment. The logical expressions involved with the decoding circuit can be constructed as follows, by way of example:

Assuming that the pattern assignment of the data words is

| (Y₂Y₁) |
| --- |
| A → 1 0 |
| B → 1 1 |
| C → 0 1 |
| D → 0 0 | the reverse-converted output data bit series $Y_1$, $Y_2$ can be made $Y_1 = X_{11} + X_{12} \cdot X_{15} \cdot \overline{X_{20}} + X_9 \cdot \overline{X_{15}} + \overline{X_4} \cdot \overline{X_5} \cdot X_{10} \cdot \overline{X_{15}}$ $Y_2 = X_{12} + X_{13} + X_{14} + X_{15} + X_4 \cdot (X_9 \cdot \overline{X_{14}} + X_{10}) \cdot \overline{X_{15}}$.

The teachings of the third embodiment hold also for X and Y.

As described above, the variable-length code converting method of the present invention makes the basic data length five bits, converts a 2×r-bit data word into a 5×r-bit code word, makes the run number of "0"s between a "1" and a "1" in the binary bit pattern of the code word following conversion a minimum value of "4", and makes the code word length number $r_{max}=3$, which is more compact. As a result, in comparison with the conventional 4/11 code, recording at a density higher by a factor of 1.38 is possible where the same amount of waveform interference is allowed. In addition, the coding circuit and decoding circuit can be simply constructed of gate circuitry.

As many apparently widely different embodiments of the present invention can be made without departing from the spirit and scope thereof, it is to be understood that the invention is not limited to the specific embodiments thereof except as defined in the appended claims.

What is claimed is:

1. A method for outputting optimized digital data in a form which facilitates at least one of storage of said optimized digital data on a recording medium and transmission of said optimized digital data to a remote location, comprising the steps of:

providing an input means for inputting digital data;

providing a processing means for processing the input digital data input by the input means by encoding binary data into 5-bit code word for every 2-bit binary data (data word), in order to record digital data in a recording medium or transmit digital data; and providing an output means for outputting data processed by the processing means the encoding step comprising the steps of;

(a) inputting a plurality of data words by said input means, (b) transferring a series of four data words of 8 bits length of said plurality of data words to said processing means, (c) discriminating whether or not said series of four data words correspond with a first data array, and if it is discriminated by said processing means that said series of four data words correspond with the first data array, encoding said series of four data words into predetermined four code words of 20 bits length by said processing means and transferring said four code words to said output means, (d) if it is discriminated by said processing means that the series of four data words do not correspond with the first data array in step (c), discriminating whether or not a series of three data words of 6 bits length correspond with a second data array by said processing means, and if it is discriminated by said processing means that said series of three data words correspond with the second data array, encoding said series of three data words into predetermined three code words of 15 bits length by said processing means and transferring said three code words to said output means, (e) if it is discriminated by said processing means that said series of three data words do not correspond with the second data array in step (d), discriminating whether or not a series of two data words of 4 bits length correspond with a third data array by said processing means, and if it is discriminated by said processing means that said series of two data words correspond with the third data array, encoding said series of two data words into predetermined two code words of 10 bits length by said processing means and transferring said two code words to said output means, and (f) if it is discriminated by said processing means that the series of two data words do not correspond with the third data array in step (e), encoding one data word into a predetermined 5-bit code word, in accordance with a type of the 2-bit data word by said processing means and transferring said 5-bit code word to said output means, wherein a number of bit "0" between bit "1" and bit "1" is from four to nineteen, whereby said 2-bit binary data input by said input means is encoded into 5-bit code word and output.

2. The method according to claim 1 wherein in said step (d), discrimination of whether or not said series of three data words correspond with the second data array is made with respect to the first three data words of said series of four data words subjected to discrimination of whether or not said series of four data words correspond with the first data array in said step (c).

3. The method according to claim 1 wherein in said step (e), discrimination of whether or not said series of two data words correspond with the third data array is made with respect to the first two data words of said series of three data words subjected to discrimination of whether or not said series of three data words correspond with the second data array in said step (d).

4. The method according to claim 1, wherein in said step (f), encoding to the predetermined word is made with respect to the first data word of said series of two data words subjected to discrimination of whether or not said series of two data words correspond with the third data array in said step (e).

5. A method for outputting optimized digital data in a form which facilitates at least one of storage of said optimized digital data on a recording medium and transmission of said optimized digital data to a remote location, comprising the steps of:

provifing an input means for inputting digital data;

providing a processing means for processing the digital data input by said input means by encoding binary data into (5×r)-bit code word for every (2×r)=bit ($1 \leq r \leq 4$) binary data (data word), in order to record digital data in a recording medium or transfer digital data, comprising the steps of:

(a) inputting a plurality of data words by said input means; and (b) transferring said plurality of data words to said processing means, wherein, in a case where four types of 2-bit data words (00, 01, 10, 11) are respectively assigned to any of A, B, C and D, said processing unit encoding the (2×r)-bit data words into the (5×r)-bit code words by said processing means, while giving the priority to a data word having a large number of bits, in accordance with following relations:

| DATA WORD | CODE WORD |
|---|---|
| A | (10000) |
| B | (01000) |
| C | (00100) |
| D | (00010) |
| BA | (10000 00000) |
| CA | (01000 00000) |
| CB | (00100 00000) |
| DA | (00010 00000) |
| DB | (00001 00000) |
| BBA | (10000 00000 00000) |
| CCA | (01000 00000 00000) |
| DCA | (00100 00000 00000) |
| DCB | (00010 00000 00000) |
| DCD | (00001 00001 00000) |
| BBBA | (00001 00001 00000 00000) |
| CCCA | (00001 00001 00001 00000) |
| DDCA | (00001 00000 00000 00000) | whereby the (2×r)-bit ($1 \leq r \leq 4$) binary data is encoded into (5×r)-bit code words; and providing an output means for outputting data processed by the processing means.

6. A method for outputting optimized digital data in a form which facilitates at least one of storage of said optimized digital data on a recording medium and transmission of said optimized digital data to a remote location, comprising the steps of:

providing an input means for inputting digital data;

providing a processing means for processing the digital data by encoding binary data into (5×r)-bit code word for every (3×r)-bit ($1 \leq r \leq 2$) binary data (data word), comprising the step of, (a) inputting a plurality of data words by said input means; and (b) transferring the plurality of data words to said processing means, wherein, in a case where eight types of 3-bit data words (000, 001, 010, 011, 100, 101, 110, 111) are respectively assigned to any of A, B, C, D, E, F, G and H, and X represents a complement of a first one bit of a next code word to be connected, encoding the (3×r)-bit data words into the (5×r)-bit code words by said processing means, while giving the priority to a data word having a large number of bits, in accordance with the following relations:

| DATA WORD | CODE WORD |
|---|---|
| A | 1000X |
| B | 0100X |
| C | 0010X |
| D | 00010 |
| E | 1010X |
| F | 10010 |
| G | 01010 |
| H | 00001 |
| HA | 01000 0100X |
| HE | 00100 0100X |
| HF | 00100 0010X | whereby (3×r)-bit data words ($1 \leq r \leq 2$) are converted into the (5×r)-bit code word and output; and providing an output means for outputting data processed by the processing means.

7. An encoding apparatus for outputting optimized digital data in a form which facilitates at least one of storage of said optimized digital data on a recording medium and transmission of said optimized digital data to a remote location, said encoding apparatus comprising:

input means for inputting an initial digital data;

processing means for processing the initial digital data input by the input means by encoding binary data into 5-bit code word for every 2-bit binary data (data word), by (a) inputting a plurality of data words by said input means, (b) transferring a series of four data words of 8 bits length of said plurality of data words to said processing means, (c) discriminating whether or not said series of four data words correspond with a first data array, and when it is discriminated by said processing means that said series of four data words correspond with the first data array, encoding said series of four data words into predetermined four code words of 20 bits length by said processing means and transferring said four code words to said output means, (d) when it is discriminated by said processing means that the series of four data words do not correspond with the first data array in step (c), discriminating whether or not a series of three data words of 6 bits length correspond with a second data array by said processing means, and when it is discriminated by said processing means that said series of three data words correspond with the second data array, encoding said series of three data words into predetermined three code words of 15 bits length by said processing means and transferring said three code words to said output means, (e) when it is discriminated by said processing means that said series of three data words do not correspond with the second data array in step (d), discriminating whether or not a series of two data words of 4 bits length correspond with a third data array by said processing means, and when it is discriminated by said processing means that said series of two data words correspond with the third data array, encoding said series of two data words into predetermined two code words of 10 bits length by said processing means and transferring said two code words to said output means, and (f) when it is discriminated by said processing means that the series of two data words do no correspond with the third data array in step (e), encoding one data word into a predetermined 5-bit code word, in accordance with a type of the 2-bit data word by said processing means and transferring said 5-bit code word to said output means, wherein a number of bit "0" between bit "1" and bit "1" is from four to nineteen, whereby said 2-bit binary data input by said input means is encoded into 5-bit code word and output; and output means for outputting said optimized data processed by the processing means for one of storage of said optimized digital data on a recording medium and transmission of said optimized digital data to a remote location.

8. An encoding apparatus for outputting optimized digital data in a form which facilitates at least one of storage of said optimized digital data on a recording medium and transmission of said optimized digital data to a remote location, said encoding apparatus comprising:

input means for inputting an initial digital data;

processing means for processing the initial digital data input by the input means by encoding binary data into (5 ×r)-bit code word for every (2×r)=bit ($1 \leq r \leq 4$) binary data (data word), in order to record digital data in a recording medium or transfer digital data, comprising the step of, (a) inputting a plurality of data words by said input means and transferring said plurality of data words to said processing means, (b) in a case where four types of 2-bit data words (00, 01, 10, 11) are respectively assigned to any of A, B, C and D, encoding the (2×r)-bit data words into the (5×r)-bit code words by said processing means, while giving the priority to a data word having a large number of bits, in accordance with following relations,

| DATA WORD | CODE WORD |
|---|---|
| A | (10000) |
| B | (01000) |
| C | (00100) |
| D | (00010) |
| BA | (10000 00000) |
| CA | (01000 00000) |
| CB | (00100 00000) |
| DA | (00010 00000) |
| DB | (00001 00000) |
| BBA | (10000 00000 00000) |
| CCA | (01000 00000 00000) |
| DCA | (00100 00000 00000) |
| DCB | (00010 00000 00000) |

| DATA WORD | CODE WORD |
|---|---|
| DCC | (00001 00000 00000) |
| DCD | (00001 00001 00000) |
| BBBA | (00001 00001 00000 00000) |
| CCCA | (00001 00001 00001 00000) |
| DDCA | (00001 00000 00000 00000) | whereby the (2×r)-bit ($1 \leq r \leq 4$) binary data is encoded into (5×r)-bit code words and output; and output means for outputting said optimized data processed by the processing means for one of storage of said optimized digital data on a recording medium and transmission of said optimized digital data to a remote location.

9. An encoding apparatus for outputting optimized digital data in a form which facilitates at least one of storage of said optimized digital data on a recording medium and transmission of said optimized digital data to a remote location, said encoding apparatus comprising:

input means for inputting an initial digital data;

processing means for processing the initial digital data input by the input means by encoding binary data into (5×r)-bit code word for every (3×r)-bit ($1 \leq r \leq 2$) binary data (data word), comprising the steps of, (a) inputting a plurality of data words by said input means and transferring said plurality of data words to said processing means, (b) in a case where eight types of 3-bit data words (000, 001, 010, 011, 100, 101, 110, 111) are respectively assigned to any of A, B, C, D, E, F, G and H, and X represents a complement of a first one bit of a next code word to be connected, encoding the (3×r)-bit data words into the (5×r)-bit code words by said processing means, while giving the priority to a data word having a large number of bits, in accordance with the following relations,

| DATA WORD | CODE WORD |
|---|---|
| A | 1000X |
| B | 0100X |
| C | 0010X |
| D | 00010 |
| E | 1010X |
| F | 10010 |
| G | 01010 |
| H | 00001 |
| HA | 01000 0100X |
| HE | 00100 0100X |
| HF | 00100 0010X | whereby (3×r)-bit data words ($1 \leq r \leq 2$) are converted into the (5×r)-bit code word; and output means for outputting said optimized data processed by the processing means for one of storage of said optimized digital data on a recording medium and transmission of said optimized digital data to a remote location.

* * * * *

UNITED STATES PATENT AND TRADEMARK OFFICE
CERTIFICATE OF CORRECTION

PATENT NO. : 5,486,828

DATED : January 23, 1996

INVENTOR(S) : FUMIYUKI MIKAMI

Page 1 of 3

It is certified that error appears in the above-identified patent and that said Letters Patent is hereby corrected as shown below:

Title page, item [57] Abstract;

Line 11 and 14:
"decode" should be deleted.
"$\overline{X_{13} \cdot \overline{14}}$" should read --$\overline{X}_{13} \cdot \overline{X}_{14}$--.

COLUMN 1

Line 4, "continuation," should read --continuation--.

COLUMN 2

Line 40, "$T_{ma}X/T_{min}$" should read --$T_{max}/T_{min}$--.
Line 51, "r·m-bits" should read --r·m bits--.

COLUMN 4

Line 64, "therefore" should read --therefor--.

COLUMN 5

Line 4, "where" should read --where r--.

COLUMN 7

Line 66, "$\alpha$is" should read --$\alpha$ is--.

UNITED STATES PATENT AND TRADEMARK OFFICE
CERTIFICATE OF CORRECTION

PATENT NO. : 5,486,828

DATED : January 23, 1996

INVENTOR(S): FUMIYUKI MIKAMI

It is certified that error appears in the above-identified patent and that said Letters Patent is hereby corrected as shown below:

COLUMN 8

Line 2, "word is" should read --word $\alpha$ is--.

COLUMN 9

Line 28, "n=5 -bits," should read --n=5 bits,--.

COLUMN 13

Line 43, "$\overline{X_{20}}$ +X$_9$" should read --$\overline{X_{20}}$+X$_9$--.

COLUMN 14

Line 10, "means" should read --means,--.
Line 11, "of;" should read --of:--.

COLUMN 15

Line 19, "(2xr)=bit" should read --(2xr)-bit--.
Line 46, "DCB          (00010 00000 00000)"
         should read
         --DCB         (00010 00000 00000)
           DCC         (00001 00000 00000)--.
Line 65, "step of," should read --steps of:--.

UNITED STATES PATENT AND TRADEMARK OFFICE
CERTIFICATE OF CORRECTION

PATENT NO. : 5,486,828

DATED : January 23, 1996

INVENTOR(S) : FUMIYUKI MIKAMI

It is certified that error appears in the above-identified patent and that said Letters Patent is hereby corrected as shown below:

COLUMN 17

```
Line 10, "no" should read --not--.
Line 33, "(2xr)=bit" should read --(2xr)-bit--.
Line 35, "data,," should read --data,--.
Line 36, "step of," should read --steps of:--.
```

COLUMN 18

```
Line 26, "of," should read --of:--.
```

Signed and Sealed this

First Day of October, 1996

BRUCE LEHMAN

Attesting Officer     Commissioner of Patents and Trademarks